United States Patent [19]
Noro

[11] Patent Number: 5,818,372
[45] Date of Patent: Oct. 6, 1998

[54] D/A CONVERTER CIRCUIT HAVING OFFSET VOLTAGE APPLICATION DEVICE

[75] Inventor: Masao Noro, Shizuokaka-ken, Japan

[73] Assignee: Yamaha Corporation, Hammamatsu, Japan

[21] Appl. No.: 644,652

[22] Filed: May 7, 1996

[30] Foreign Application Priority Data

May 8, 1995 [JP] Japan ................................ 7-134831

[51] Int. Cl.⁶ .................................................. H03M 1/20
[52] U.S. Cl. ............................ 341/131; 341/144; 341/118
[58] Field of Search .................................... 341/144, 159, 341/140, 141, 118, 131

[56] References Cited

U.S. PATENT DOCUMENTS 5,148,163  9/1992  Frindle ..................................... 341/131
5,225,835  7/1993  Majima et al. ........................... 341/143

*Primary Examiner*—Marc S. Hoff
*Attorney, Agent, or Firm*—Pillsbury Madison & Sutro LLP

[57] ABSTRACT

A D/A converter circuit has at least two multiple-bit type D/A converters connected in parallel with each other. The circuit also includes a random signal generation circuit that generates a random signal voltage having a voltage value that timewise, randomly changes at each sampling cycle. The random signal voltage is added to and subtracted from a digital signal to be inputted to the at least two D/A converters. As a result, offset voltages whose sum is zero are added to the digital signals to be inputted to the D/A converters. The signals are D/A converted by the plurality of D/A converters to provide analog outputs, which are then added together by an analog adder.

13 Claims, 3 Drawing Sheets

|   | T1 | T2 | T3 | T4 |
|---|----|----|----|----|
| A | 3  | −6 | −3 | 2  |
| B | −5 | 1  | 5  | −6 |
| C | 2  | 5  | −2 | 4  |

D/A CONVERTER CIRCUIT HAVING OFFSET VOLTAGE APPLICATION DEVICE

BACKGROUND OF THE INVENTION

1. Field of the Invention

The present invention relates to a multiple-bit type Digital To Analog (D/A) converter.

2. Description of Related Art

It is difficult to achieve a high level of accuracy by a conventional multiple-bit type D/A converter using ladder resistors and capacity ratios. In particular, when a D/A converter using ladder resistors and capacity ratios operates at a high bit number in a range between, for example, 16 bits and 20 bits, the linearity of the output characteristic of the D/A converter becomes inaccurate. For example, FIG. 5 shows an output characteristic of a conventional D/A converter. In theory, when a digital signal, whose bit number is successively increased one by one, is inputted to a D/A converter, the D/A converter should provide a step-wise analog signal that linearly increases as shown by a solid line with each step voltage having a value corresponding to a least significant bit (LSB) of the digital signal. However, in actual practice, the D/A converter provides a step-wise voltage in which the voltage value at each step varies one from the other, as shown by a broken line in FIG. 5. As a result, the D/A converter has a non-linear output characteristic, or distortion.

To compensate for this non-linearity of a D/A converter, it has been proposed to operate a plurality of D/A converters connected in parallel with each other. It is noted that non-linear characteristic curves of D/A converters are different in shape from each other and thus not uniform. In other words, a plurality of D/A converters provide a plurality of different non-linear characteristic curves. Therefore, when a plurality of D/A converters are operated in parallel with each other, the non-linearity curves of the D/A converters are averaged and the overall linearity is improved.

In general, the more parallel D/A converters, the higher the linearity of output characteristic of the D/A converters. However, the use of many parallel D/A converters results in a higher cost, and an increased size of an IC when these parallel D/A converters are integrated on the IC.

SUMMARY OF THE INVENTION

It is an object of the present invention to provide a converter circuit having a fewer number of D/A converters which provides an improved linearity comparable with that of a converter circuit that utilizes a larger number of D/A converters.

In accordance with an embodiment of the present invention, a converter circuit has a plurality of D/A converters that are connected in parallel with each other. An offset voltage application device adds offset voltages, whose sum is zero, to a digital signal that is coupled to input terminals of the respective D/A converters. An adder device adds signals outputted from the plurality of D/A converters to provide an analog signal. As a result, characteristic curves for the signals outputted from the plurality of D/A converters are substantially averaged and the overall output characteristic of the analog signal has an improved linearity. Furthermore, when the signals outputted from the plurality of D/A converters are finally added by the adder device, the offset voltages added to the digital signal are substantially offset by each other, and therefore substantially do not appear on the analog signal finally outputted from the adder device.

In accordance with another embodiment of the present invention, the offset voltage application device includes a random signal generator that generates a random signal whose level is randomly changed at each sampling cycle and an adder device coupled to the random signal generator. The adder device adds the random signal to the digital signal to be supplied to each of the plurality of D/A converters at each sampling cycle. In accordance with a preferred embodiment of the present invention, the adder device forms offset voltages whose sum is zero based on the random signal. Accordingly, each of the offset voltages has a value that randomly changes at each sampling cycle. As a result, the converter circuit provides a substantial averaging effect in which the signals outputted from the D/A converters each having a different non-linear curve along a time axis are averaged. As a consequence, a fewer number of D/A converters can provide improved linearity of the output characteristic of the analog signal. It is noted that an error may be generated when the signals outputted from the plurality of D/A converters are added by the adder device, and the error results in a noise. However, by using the random signal, a noise generated as a result of an error in the addition of signals outputted from the plurality of D/A converters approximates to a white noise. As a result, undesirable effects that may be generated by the addition of the offset voltages can be reduced.

The non-linearity of an analog signal outputted by the converter circuit is improved with respect to the digital signals that are within a range of relatively low digital signal levels. Within such a range, the application of the offset voltages substantially improves the linearity of the output characteristic of the analog signal finally provided by the conversion circuit. However, when a level of the digital signal to be inputted into the plurality of D/A conveners exceeds a predetermined level, the above mentioned addition error, and thus the noise, becomes substantial.

Thus, a converter circuit, in accordance with another embodiment of the present invention, further includes a level detection device to detect a level of the digital signal to be inputted into the plurality of D/A converters. The level detection device controls the offset voltage application device to stop the supply of the offset voltages when the level of the digital signal exceeds a predetermined level. In an alternative embodiment, the level detection device stops the function of adding the offset voltages to the digital signal when the level of the digital signal exceeds a predetermined level.

Other features and advantages of the invention will be apparent from the following detailed description, taken in conjunction with the accompanying drawings which illustrate, by way of example, various features of embodiments of the invention.

BRIEF DESCRIPTION OF THE DRAWINGS

A detailed description of embodiments of the invention will be made with reference to the accompanying drawings.

DETAILED DESCRIPTION OF PREFERRED EMBODIMENTS

Figure 1:
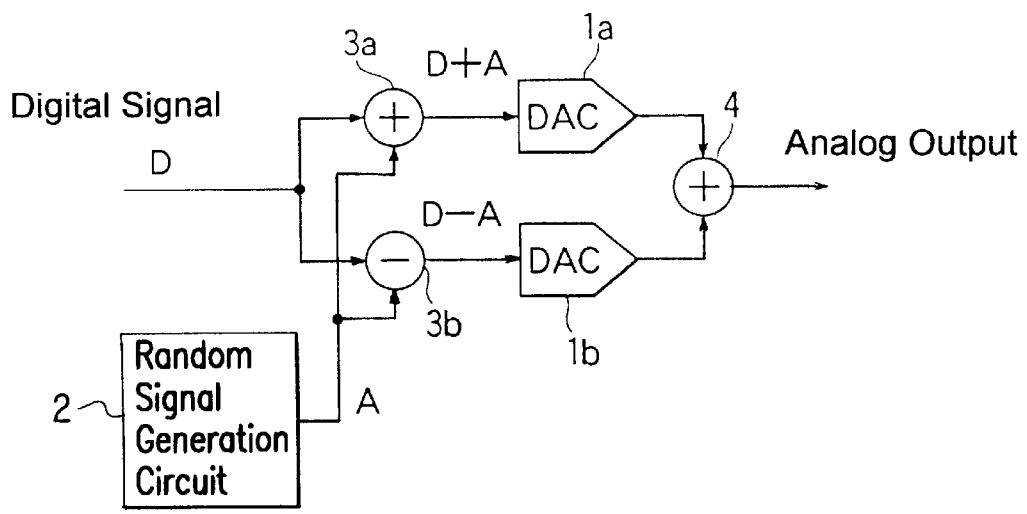
FIG. 1 shows a D/A converter circuit in accordance with a first embodiment of the present invention.

FIG. 1 shows a D/A converter circuit 10 in accordance with a first embodiment of the present invention. The D/A converter circuit 10 includes two multiple-bit type D/A converters 1a and 1b that are connected in parallel with each other. A digital signal D is commonly supplied to the D/A converters 1a and 1b. The D/A converter circuit 10 also includes a random signal generation circuit 2 and digital signal adders 3a and 3b that are connected to the random signal generation circuit 2. The random signal generation circuit 2 generates a random signal A whose level is timewise varied, and supplies the random signal A to the digital adders 3a and 3b. In the illustrated embodiment, the digital adder 3a adds the random signal A to the digital signal D and the digital adder 3b subtracts the random signal A from the digital signal D. The digital signal D is supplied to the D/A converters 1a and 1b via the digital signal adders 3a and 3b, respectively. Outputs from the two D/A converters 1a and 1b are then added and outputted by an analog adder 4.

In a preferred embodiment, one of the adders (e.g., 3a) adds the random signal having a voltage value of A to the digital signal having a voltage value of D, and supplies a voltage of (D+A) to an input terminal of the D/A converter 1a. The other of the adders (e.g., 3b) inverts the polarity of the random signal, and then adds the random signal to the digital signal. In other words, the adder 3b subtracts the random signal having the voltage value of A from the digital signal having the voltage value of D. The adder 3b thus supplies a voltage of (D−A) to an input terminal of the D/A converter 1b. By this operation, two offset voltages whose sum is zero, namely, the voltage of +A and the voltage of −A, are added to the digital signals to be supplied to the two D/A converters 1a and 1b, respectively.

In accordance with this embodiment of the present invention, the random signal generation circuit 2 randomly and timewise varies a signal having a voltage value of A at each sampling cycle so that the signal has voltage values $A_1$, $A_2$, $A_3$, ... $A_n$ that are different from each other at each sampling cycle. The digital adder device 3a adds each of the random signals having an offset voltage value ($A_1$, $A_2$, $A_3$, ..., $A_n$) to the digital signal to be inputted to the D/A converter 1a. In a similar manner, the digital adder device 3b adds each of the random signals having an offset voltage value ($-A_1$, $-A_2$, $-A_3$, ..., $-A_n$) to the digital signal to be inputted to the D/A converter 1b at each sampling cycle.

An optimum magnitude of the random signal voltage A is determined according to the number of bits of the D/A converters 1a and 1b. For example, when each of the D/A converters 1a and 1b is capable of converting a signal having bits ranging between 16 bits and 20 bits, the random signal voltage A has bits ranging from about 3 bits to about 8 bits.

It is noted that when a digital signal is added with offset voltages having opposite polarities and is then D/A converted, the resultant analog signal has a non-linear curve that is different from a non-linear curve that would be obtained for the digital signal if no offset voltages were added. The offset voltages appear on the resultant analog outputs outputted from the D/A converters 1a and 1b. However, because the offset voltages each have a polarity that is inverted (e.g., opposite) with respect to one another, the offset voltages substantially cancel out each other when added by the adder 4 and do not appear in an analog output that is finally produced by the adder 4. Accordingly, the linearity is improved as a result of the averaging effect in which different non-linear curves are substantially averaged.

In accordance with the embodiment of the present embodiment, the offset voltages are generated based on a random signal and added to the digital signal D at each sampling cycle. As a result, the digital signal D is D/A converted into analog signals having a variety of different non-linear curves along a time axis. These non-linear curves are substantially averaged when they are added together by the adder 4. This method results in a averaging effect with improved linearity that is comparable to that obtained by methods using substantially many more D/A converters which are connected in parallel with each other.

The D/A converter circuit 10 may be used in combination with a digital filter (not shown) in an over sampling operation. In this case, the digital signal is first inputted in the digital filter and then to the D/A converter circuit 10. By the use of the digital filter, D/A conversion is performed at a sampling frequency that is, for example, four times or eight times larger than that performed by the D/A converter circuit 10 without using the digital filter. As a result, the averaging effect obtained further improves the linearity.

As described above, the offset voltages cancel out each other when the analog signals outputted from the D/A converters 1a and 1b are added together by the adder 4. However, an error may be generated when the analog signals are added together, and these errors result in noise. It is noted that because random signal voltages are used, the noise derived from these errors in the added analog signals approximates to white noise. Accordingly undesirable effects that may result from the addition of analog signals are substantially lowered.

Random signal voltages applied as offset voltages are not effective if the voltages are too small. On the other hand, a large output noise occurs if the random signal voltages are too large with respect to the bit size of the D/A converters 1a and 1b. Therefore, in accordance with an embodiment of the present invention, the random signal voltage A is set to a range of about 3 bits–8 bits when each of the D/A converters 1a and 1b is capable of converting a signal of 16 bits through 20 bits, which substantially reduces the output noise and effectively improves the linearity.

Figure 2:
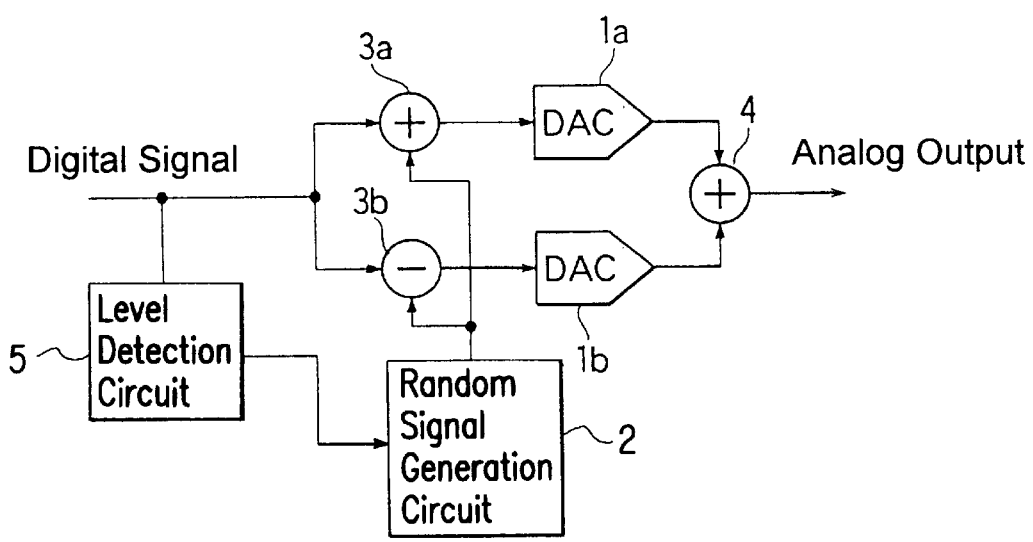
FIG. 2 shows a D/A converter circuit in accordance with a second embodiment of the present invention.

FIG. 2 shows a D/A converter circuit 20 in accordance with a second embodiment of the present invention. Parts corresponding to those of the embodiment of FIG. 1 are numbered with the same reference numerals as shown in FIG. 1, and a detailed description of these parts is omitted.

The random signal generation circuit 2 generates a random signal having an offset voltage A whose level is timewise varied, and which is supplied to the digital adders 3a and 3b. In the illustrated embodiment, the digital adder 3a adds the random signal A to the digital signal D and the digital adder 3b subtracts the random signal A from the digital signal D. As a result, the D/A converter circuit 20 performs a signal overlapping operation in which offset voltages having opposite polarities with respect to each other are overlapped in the digital signal D. The digital signal is then D/A converted by two parallel D/A converters 1a and 1b. As a result, analog outputs from the two D/A converters 1a and 1b have offset non-linear curves. The analog outputs from the D/A converters 1a and 1b are then added together by an adder 4. It is noted that when the level of the digital signal input is high and exceeds a predetermined level, an error generated in the addition of analog signal outputs becomes relatively large and accordingly noise derived from these error also becomes large. In order to determine the level of the digital signal D to be inputted to the D/A converters 1a and 1b, a level detection circuit 5 is provided in addition to the elements shown in FIG. 1. The level detection circuit 5 detects when the level of the digital signal exceeds a predetermined level, and stops the operation of overlapping the offset voltages to a digital signal D to be inputted to the D/A conveners 1a and 1b. In an alternative embodiment, the level detection circuit 5 detects when the level of the digital signal exceeds a predetermined level, and the signal output from the random signal generation circuit 2 is stopped in response to the detection by the level detection circuit 5. In other words, the level detection circuit 5 turns on and off the function of adding the offset voltages to a digital signal D to be inputted to the D/A converters 1a and 1b depending on the level of the digital signal D.

It has been observed that D/A converter circuits in accordance with embodiments of the present invention are effective in improving the linearity of an analog output within a specified signal level range, when a digital signal input D has a relatively low level. The D/A converter circuit 20 shown in FIG. 2 performs the signal overlapping operation when the effectiveness of the signal overlapping operation is relatively high, in other words, when the digital signal input D is within the specified low signal level range. Therefore when the level of the digital signal input D is higher than the specified level range, the level detection circuit 5 stops the signal overlapping operation to eliminate the above mentioned noise deriving from the analog signal addition error.

Figures 3, 4:
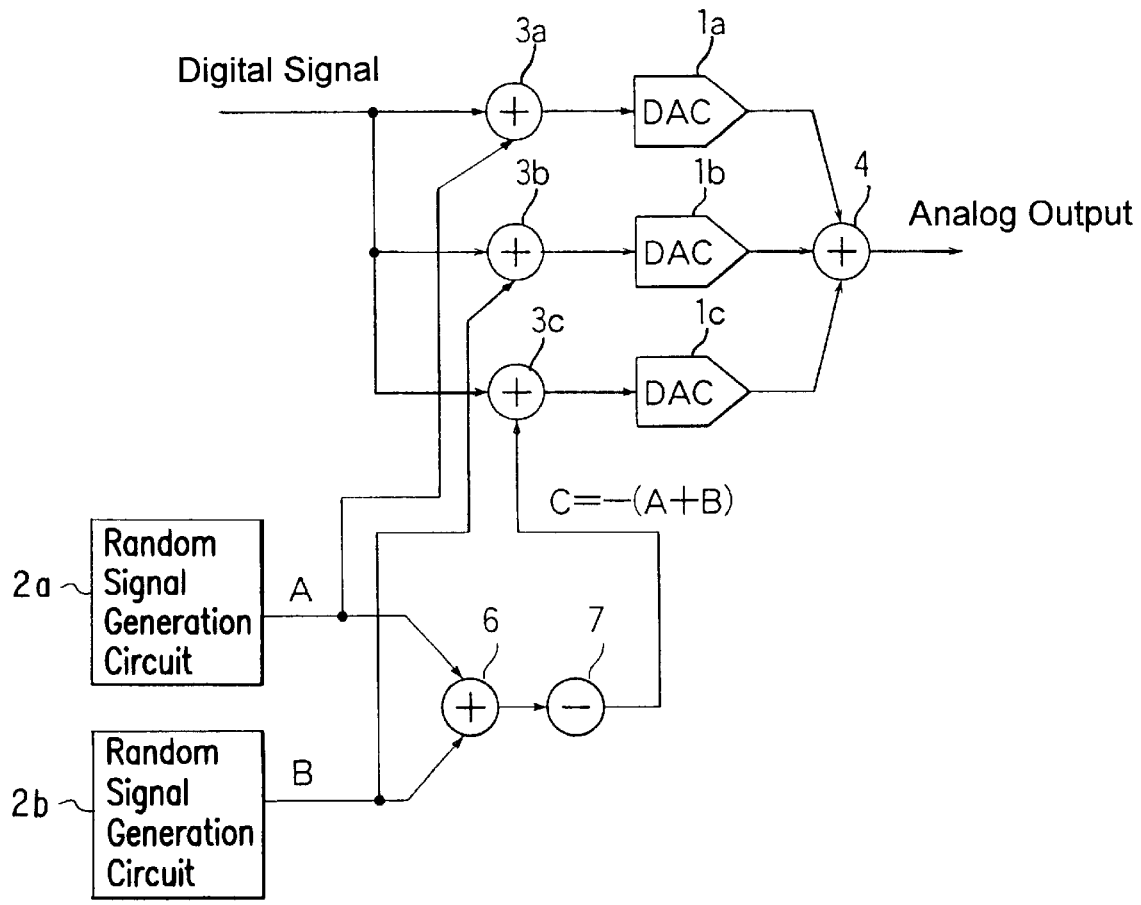
FIG. 3 shows a D/A converter circuit in accordance with a third embodiment of the present invention.
FIG. 4 shows an example of offset voltages used with the D/A converter circuit of FIG. 3.
Figure 5:
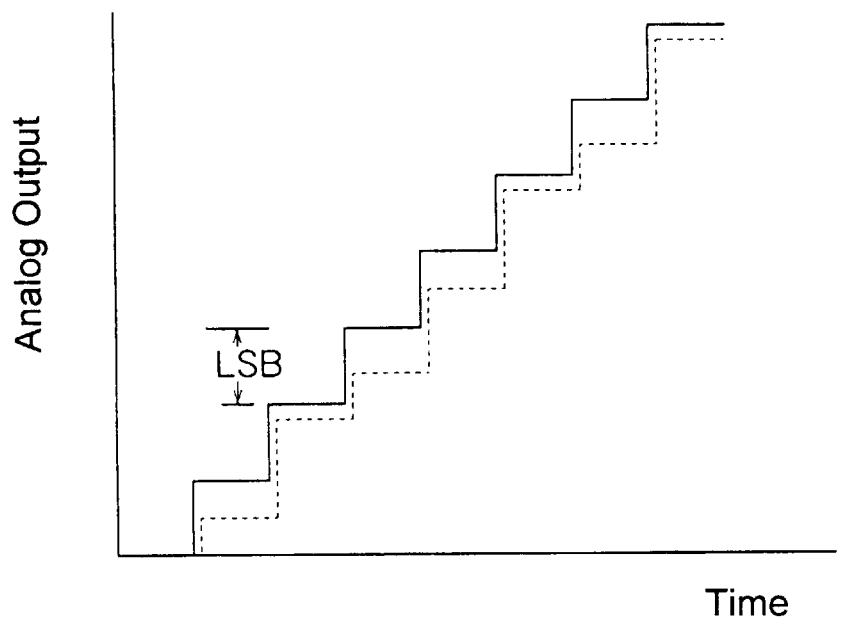
FIG. 5 shows the typical linearity of outputs after D/A conversion in typical D/A converter circuits without compensation.

FIG. 3 shows a D/A converter circuit 30 in accordance with a third embodiment of the present invention. In this embodiment, a digital signal is commonly inputted to three D/A converters 1a, 1b and 1c that are connected in parallel with each other. In order to provide offset voltages whose sum is zero, two random signal generation circuits 2a and 2b are provided.

The two random signal generation circuits 2a and 2b generate random signal voltages A and B, respectively. The random signal voltages A and B are added together by an adder 6, and the polarity of an output from the adder 6 is then inverted by a subtracter 7 to obtain a voltage of C=−(A+B). These signal voltages A, B and C are applied as offset voltages to the digital signal inputted to adders 3a, 3b and 3c, respectively. Outputs from the adders 3a, 3b and 3c are supplied to the D/A converters 1a, 1b and 1c, respectively. Outputs from the D/A converters 1a, 1b and 1c are then added together by an analog adder 4 in a similar manner performed by the embodiments shown in FIGS. 1 and 2.

In the D/A converter circuit 30 shown in FIG. 3, levels of these offset voltages A, B and C are randomly changed at each sampling cycle, for example, T1, T2, T3 and T4 as shown in FIG. 4. and the sum of these offset voltages A, B and C are zero at each sampling cycle. In this embodiment, the linearity obtained by the D/A conversion is further improved due to a larger number of D/A converters.

In a further embodiment of the present invention, four or more D/A converters and the corresponding number of offset voltages may be used.

It is noted that the averaging effect of each of the embodiments shown in FIG. 2 and FIG. 3 will be improved by using a digital filter disposed upstream of the D/A converters 1a, 1b and 1c, in a similar manner as the first embodiment.

As described above, in accordance with the present invention, a plurality of D/A converters are connected in parallel with each other, offset voltages whose sum is zero are applied to a digital signal to be inputted to the plurality of D/A converters, and analog signals from the D/A converters are added together by an adder. As a result, a fewer number of D/A converters will provide an improved linearity comparable to that obtained by many more parallel D/A converters.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A D/A converter apparatus for converting a digital signal, the D/A converter apparatus comprising:
   a digital signal input for receiving the digital signal;
   a plurality of D/A converters connected in parallel with each other and commonly coupled to the digital signal input, each of the D/A converters producing an analog output;
   an offset voltage overlapping device that supplies offset voltages each sampling cycle, the supplied offset voltages being added to the digital signal supplied to the D/A converters such that a sum of the offset voltages added to the digital signal during any one sampling cycle is substantially zero; and
   an adder device that adds together analog outputs from the plurality of D/A converters.

2. A D/A converter apparatus as defined in claim 1, wherein the offset voltage overlapping device includes:
   at least one signal generation device that generates a signal used to form the offset voltages; and
   a plurality of adder devices commonly coupled to the digital signal input and the at least one signal generation device, and each having an output connected to a corresponding one of the D/A converters, each of the plurality of adder devices forming one of the offset voltages based on the signal provided from the at least one signal generation device, and superimposing the one offset voltage to the digital signal to be provided to the corresponding D/A converter.

3. A D/A converter apparatus as defined in claim 1, further comprising a level detection device that detects a level of the digital signal to be inputted to the plurality of D/A converters, and halts the offset voltage overlapping device when the level of the digital signal reaches a predetermined level.

4. A D/A converter apparatus as defined in claim 1, wherein the offset voltage overlapping device includes:
   at least one random signal generation device that generates a random signal having a value that randomly changes each sampling cycle; and
   a plurality of adder devices commonly coupled to the digital signal input and the at least one random signal generation device, and each having an output connected to a corresponding one of the D/A converters, each of the plurality of adder devices forming one of the offset voltages based on the random signal provided from the at least one random signal generation device, and superimposing the one offset voltage to the digital signal to be provided to the corresponding D/A converter each sampling cycle.

5. A D/A converter apparatus as defined in claim 4, wherein the at least one random signal generation device is defined by one random signal generation device, and the plurality of adder devices are defined by two adder devices.

6. A D/A converter apparatus as defined in claim 5, wherein one of the two adder devices add the random signal to the digital signal and another of the two adder devices subtracts the random signal from the digital signal.

7. A D/A converter apparatus as defined in claim 4, further comprising a level detection device that detects a level of the digital signal to be inputted to the plurality of adder devices, and halts the random signal when the level of the digital signal reaches a predetermined level.

8. A D/A converter apparatus for converting a digital signal, the D/A converter apparatus comprising:

a digital signal input for receiving the digital signal;

a plurality of D/A converters connected in parallel with each other and commonly coupled to the digital signal input, each of the plurality of D/A converters producing an analog output;

a plurality of random signal generation devices, each of the plurality of random signal generation devices generating a random signal having a value that randomly changes each sampling cycle;

a plurality of adder devices, each of the plurality of adder devices commonly coupled to the digital signal input and at least one of the plurality of random signal generation devices, and each having an output connected to a corresponding one of the D/A converters, each of the plurality of adder devices forming an offset voltage based on at least one of the random signals, and superimposing the offset voltage to the digital signal to be provided to the corresponding D/A converter; and an analog adder device that adds together the analog outputs from the plurality of D/A converters, wherein a sum of the offset voltages that are superimposed to the digital signal during any one sampling cycle is substantially zero.

9. A D/A converter apparatus as defined in claim 8, wherein the plurality of random signal generation devices are defined by a first random signal generation device and a second random signal generation device, the plurality of adder devices are defined by a first adder device, a second adder device, and a third adder device, the first adder device adds a first random signal provided by the first random signal generation device to the digital signal, the second adder device adds a second random signal provided by the second random signal generation device to the digital signal, and the third adder device adds the first random signal and the second random signal to provide a sum signal, inverts a polarity of the sum signal, and then adds the sum signal to the digital signal.

10. A method of converting a digital signal to an analog signal, the method comprising the steps of:

commonly supplying a digital signal to a plurality of D/A converters connected in parallel with each other, each of the plurality of D/A converters producing an analog output;

generating offset voltages, a sum of the offset voltages being substantially equal to zero;

for each of the D/A converters, adding one of the offset voltages to the digital signal being supplied to the D/A converter; and adding together analog outputs from the plurality of D/A converters.

11. A method as defined in claim 10, further comprising the steps of:

detecting a level of the digital signal supplied to the plurality of D/A converters; and substantially stopping generation of the offset voltages when the level of the digital signal reaches a predetermined level.

12. A method as defined in claim 10, further comprising the step of:

generating at least one random signal having a value that randomly changes each sampling cycle, wherein the offset voltages are formed based on the at least one random signal.

13. A method as defined in claim 10, further comprising the steps of:

generating a first random signal and a second random signal;

using the first random signal as a first offset voltage;

using the second random signal as a second offset voltage; and generating a third offset voltage by adding the first random signal and the second random signal, and then inverting a polarity of the sum, wherein each of the first random signal, the second random signal and the third random signal have a value that randomly changes each sampling cycle.

* * * * *